(12) United States Patent
Bernard et al.

(10) Patent No.: US 11,821,957 B2
(45) Date of Patent: Nov. 21, 2023

(54) ELECTROCHEMICAL CELL AND BATTERY WITH INTEGRATED SENSOR AND/OR ACTUATOR

(71) Applicant: SAFT, Levallois-Perret (FR)

(72) Inventors: Patrick Bernard, Bordeaux (FR); Philippe Borel, Bruges (FR); Laure Le-Guenne, Blanquefort (FR); Gerard Rigobert, Fargues St Hilaire (FR)

(73) Assignee: SAFT, Levallois-Perret (FR)

( * ) Notice: Subject to any disclaimer, the term of this patent is extended or adjusted under 35 U.S.C. 154(b) by 783 days.

(21) Appl. No.: 16/637,547

(22) PCT Filed: Aug. 22, 2018

(86) PCT No.: PCT/EP2018/072684
§ 371 (c)(1),
(2) Date: Feb. 7, 2020

(87) PCT Pub. No.: WO2019/038336
PCT Pub. Date: Feb. 28, 2019

(65) Prior Publication Data
US 2020/0259220 A1    Aug. 13, 2020

(30) Foreign Application Priority Data

Aug. 24, 2017   (FR) ..................................... 17 57853

(51) Int. Cl.
*H01M 10/48*       (2006.01)
*H01M 10/0525*     (2010.01)
(Continued)

(52) U.S. Cl.
CPC ......... *G01R 31/392* (2019.01); *G01R 31/364* (2019.01); *H01M 4/0438* (2013.01);
(Continued)

(58) Field of Classification Search
None
See application file for complete search history.

(56) References Cited

U.S. PATENT DOCUMENTS

| 6,915,220 B2 | 7/2005 | Cardinal et al. |
| 2011/0048485 A1 | 3/2011 | Goff et al. |
| (Continued) | | |

FOREIGN PATENT DOCUMENTS

| CN | 106370917 A | 2/2017 |
| WO | 2016/131764 A1 | 8/2016 |
| WO | 2017/033013 A1 | 3/2017 |

OTHER PUBLICATIONS

International Search Report for PCT/EP2018/072684 dated Nov. 20, 2018 [PCT/ISA/210].

*Primary Examiner* — Christopher P Domone
(74) *Attorney, Agent, or Firm* — Sughrue Mion, PLLC

(57) ABSTRACT

The invention relates to an electrochemical element and a battery comprising one or more electrochemical elements, with integrated sensors and/or actuators, in particular including an application for monitoring the operation of an electrochemical element or a Li-ion battery, and/or triggering actions in such an element or such a battery, intended to secure the element or the battery. The electrochemical element (1) comprises a closed shell (2) defining an internal volume and a beam (3) arranged therein having alternating positive and negative electrodes respectively connected to two positive and negative electrical output terminals housing separators, the beam (3) being impregnated with electrolyte and further connected by connection means (4) to one (5) of the electrical output terminals. It further comprises one or mote self-powered sensor and/or actuator elements (20 to 24) each arranged in contact with one component selected from the shell (2), the beam (3), the connection means (4), and the output terminal (5), and capable of measuring a (Continued)

physical or chemical magnitude relative to, and/or generating a physical action or effect on, the surroundings thereof.

24 Claims, 1 Drawing Sheet

(51) Int. Cl.
  *H01M 10/42* (2006.01)
  *H01M 4/04* (2006.01)
  *H01M 4/06* (2006.01)
  *H01M 10/04* (2006.01)
  *G01R 31/364* (2019.01)
  *G01R 31/392* (2019.01)
  *H01M 50/46* (2021.01)
  *H01M 4/02* (2006.01)
  *H01M 50/54* (2021.01)

(52) U.S. Cl.
  CPC ......... *H01M 4/06* (2013.01); *H01M 10/0409* (2013.01); *H01M 10/0525* (2013.01); *H01M 10/425* (2013.01); *H01M 10/48* (2013.01); *H01M 50/46* (2021.01); *H01M 50/54* (2021.01); *H01M 2004/021* (2013.01); *H01M 2004/027* (2013.01); *H01M 2004/028* (2013.01)

(56) References Cited

U.S. PATENT DOCUMENTS

| | | |
|---|---|---|
| 2013/0157093 A1 | 6/2013 | Sisk et al. |
| 2013/0216877 A1* | 8/2013 | Campbell ........... H01M 10/484 429/91 |
| 2013/0344355 A1 | 12/2013 | Kozinsky et al. |
| 2014/0272500 A1 | 9/2014 | Roumi et al. |
| 2015/0064525 A1 | 3/2015 | Henrici et al. |
| 2015/0088253 A1* | 3/2015 | Doll ................... G01R 31/3835 623/6.22 |
| 2015/0301113 A1* | 10/2015 | Sims ...................... H04Q 9/00 324/426 |
| 2016/0315360 A1* | 10/2016 | Dickinson ........... H01M 10/486 |
| 2017/0077560 A1* | 3/2017 | Kemp ................. H01M 10/486 |

* cited by examiner

ELECTROCHEMICAL CELL AND BATTERY WITH INTEGRATED SENSOR AND/OR ACTUATOR

CROSS REFERENCE TO RELATED APPLICATIONS

This application is a National Stage of International Application No. PCT/EP2018/072684 filed Aug. 22, 2018, claiming priority based on French Patent Application No. 17 57853 filed Aug. 24, 2017.

FIELD OF THE INVENTION

The invention relates to an electrochemical cell and to a battery comprising one or more electrochemical cells, which has a built-in sensor and/or actuator. It finds particular application in the monitoring of the operation of an electrochemical cell or of a Li-ion battery, and/or for triggering actions in such an electrochemical cell or in such a battery, aimed at ensuring the safety of the cell or to the battery.

BACKGROUND OF THE INVENTION

It is known to arrange sensors in a battery for example to detect a rise in temperature. More generally, it is known to provide sensors in a battery in order to aid in the management of the safety of the battery and/or of the electrochemical cells contained therein.

However, the known devices generally require an auxiliary wiring system for the electrical supply of the sensors, as well as for the communication between sensors and the outside, that is to say the transmission of information by a sensor to the outside and the reception of information originating from the outside by a sensor.

More generally, the known devices require the use of complex apparatus furthermore having an impact on the electrochemical performance of the battery or electrochemical cells it comprises, in order to be able to access critical information on the operation of the battery or its electrochemical cells.

This complex apparatus and the above-mentioned wiring systems in fact require the use of sealed wiring feedthroughs in the casings of electrochemical cells, a source of failure or internal or external pollutions, in particular in the case of use at the core of the cell.

However, this critical information is very important, in particular to aid in the understanding of what is going on in electrochemical cells, and in the management of the safety and the lifetime of these cells, for example to ensure the safety of a battery or one of its cells in the event of incorrect use which can cause a fire, or which could arise from mechanical impact (vibration, impact, etc.). In the event of such incorrect use, the wiring and/or communication systems mentioned above may themselves fail.

Some of the critical information that it would be important to be able to collect originate at components or regions of the electrochemical cell to which it is difficult to gain access without impacting the operation of the cell. In the absence of the sensors being positioned at important locations, such as at the core of an electrochemical cell, the collected information is inaccurate.

Also, it is important to provide actuation mechanisms at certain locations of a battery or an electrochemical cell, for the purpose of acting at the very core of the cell to ensure the safety of the latter, for example in situations of incorrect use such as discussed above.

SUMMARY OF THE INVENTION

One of the aims of the invention is therefore to solve in particular the aforementioned problems. In particular, the aim of the invention is to provide an electrochemical cell and a battery provided with means for measuring information and/or actuating, for monitoring the operation and/or influencing the operation of the cell or of the battery, in order to ensure the safety of the cell or battery.

The invention thus provides an electrochemical cell comprising a closed casing defining an internal volume inside which is arranged an electrode plate group comprising an alternation of positive and negative electrodes respectively connected to positive and negative electrical output terminals and on both sides of separators, said electrode plate group being impregnated with electrolyte and moreover connected by connection means to each one of the electrical output terminals.

The electrochemical cell further comprises one or more self-powered sensor and/or actuator elements, each arranged in contact with one of the group comprising the casing, the electrode plate group, the connection means, and an output terminal, and capable of measuring a physical or chemical quantity relating to, and/or generating an action or a physical effect on, its environment.

Unlike the prior art, where the sensor and/or actuator is powered by the electrochemical cell itself or by an external power supply, power to supply the sensor and/or actuator built into the electrochemical cell according to the invention does not rely on energy produced by the electrochemical cell into which it is incorporated, but comes from its own autonomous power supply, thus independently of any power supply from the electrochemical cell.

More specifically, the term "self-powered" means that the sensor and/or actuator elements have their own power source and are neither powered by the electrochemical cell in which they are placed, nor powered by an external power supply. The sensor and/or actuator elements thus comprise an internal power supply system, for example of the secondary cell and/or primary cell type.

According to some embodiments, the electrochemical cell further comprises one or more of the following features, taken in isolation or according to all technically possible combinations:

- the at least one sensor and/or actuator element comprises an electrical supply system of the secondary cell and/or primary cell type;
- at least one of the sensor and/or actuator elements is a sensor capable of measuring an amount of detected gas or liquid, and/or the composition of a detected gas or liquid, and/or a salt concentration, and/or conductivity, and/or a mechanical stress and/or a temperature, and/or a pressure, and/or a mechanical deformation, and/or an electrical potential;
- at least one of the sensor and/or actuator elements is an actuator capable of generating a displacement, and/or a force, and/or a temperature change, and/or a change in pressure, and/or an electrical current, and/or an electrical voltage, and/or the release of one or more substances or of one or more compounds, and/or the issue of an electromagnetic signal, and/or the issue of a mechanical signal;
- at least one of the sensor and/or actuator elements is an actuator capable of generating an action or a physical effect on its environment from an external command and/or upon reaching a threshold value measured by said at least one sensor and/or actuator element or by another of said sensor and/or actuator elements;

at least one of said sensor and/or actuator elements comprises a memory capable of storing information;

at least one of said sensor and/or actuator elements comprises a receiver capable of receiving information wirelessly from the outside;

at least one of said sensor and/or actuator elements comprises a transmitter capable of transmitting information wirelessly to the outside;

at least one of said sensor and/or actuator elements is capable of switching from one to the other of a first power consumption level mode, or sleep mode, and a second power consumption level mode, or operating mode, greater than the first power consumption level;

the sensor and/or actuator elements are capable of operating over a temperature range from −40° C. to +250° C., and preferably from −20° C. to +80° C.;

the sensor and/or actuator elements are capable of operating under a relative pressure with respect to the external pressure substantially equal to 15 bar;

at least one of said sensor and/or actuator elements has a shape that is inscribed within a volume less than or equal to 125 mm$^3$;

at least one of the said sensor and/or actuator elements has a shape, the largest dimension of which is less than or equal to 5 mm;

at least one of said sensor and/or actuator elements has a shape that is inscribed in a volume less than or equal to 5 mm$^3$, preferably less than or equal to 1 mm$^3$;

at least one of said sensor and/or actuator elements has a shape of which the largest dimension is substantially between 1000 μm and 100 nm;

at least one of said sensor and/or actuator elements is encapsulated in, or totally or partially coated with a material for chemical protection and/or insulation with respect to its environment, such as a metal material, for example aluminum, a metal alloy, for example a stainless steel, a ceramic material, a polymer, for example a polyolefin;

the at least one sensor and/or actuator element is integrated into the material of the component with which it is in contact, or made integral therewith, for example by bonding or insert molding or welding, at the surface thereof;

the electrochemical cell is of the lithium-ion type;

the electrode plate group is wound around an axial winding spindle, and in that at least one of the sensor and/or actuator elements is arranged in contact with the axial winding spindle;

at least one of said sensor and/or actuator elements is arranged at one of the ends of the electrode plate group in contact with the positive electrodes and/or the negative electrodes and/or the separators;

at least one of the said sensor and/or actuator elements is arranged in an unoccupied space located between the casing and one of the ends of the electrode plate group, such as a circuit breaker region or a current connection region;

at least one of said sensor and/or actuator elements is arranged in a current connection region, in contact with the connection means and/or an output terminal;

at least one of said sensor and/or actuator elements is arranged at the core of the electrode plate group, in contact with the positive electrodes and/or the negative electrodes and/or the separators, and/or in the electrolyte;

at least one of said sensor and/or actuator elements is arranged against, and outside the casing;

at least one of said sensor and/or actuator elements is arranged against at least one of the output terminals outside the casing;

According to an advantageous embodiment, the electrochemical cell comprises a closed casing defining an internal volume inside which an electrode plate group is arranged comprising alternating positive and negative electrodes respectively connected to two positive and negative electrical output terminals and arranged on both sides of separators, said electrode plate group being impregnated with electrolyte and connected by connection means to one of the electrical output terminals, the electrochemical cell comprising one or more sensor and/or actuator elements each arranged in contact with a component within the group comprising the casing, the electrode plate group, the connection means, and an output terminal, and being able to measure a physical or chemical quantity relating to its environment and/or to generate an action or a physical effect on, its environment, and wherein the at least one sensor and/or actuator element is self-powered.

The invention also provides, according to a second aspect, a battery comprising one or more electrochemical cells electrically connected in parallel and/or in series, at least one of the electrochemical cells being an electrochemical cell as presented above.

The invention further relates, in a third aspect, to a battery comprising a plurality of electrochemical cells electrically connected in parallel and/or in series.

In a first variant, at least two of the electrochemical cells are arranged in a support structure, and the battery comprises at least a first self-powered sensor and/or actuator element arranged in contact with the support structure, able to measure a physical quantity relating to, and/or to generate an action or a physical effect on, its environment.

According to some embodiments of this first variant, the battery further comprises one or more of the following characteristics, taken in isolation or according to all technically possible combinations:

the support structure comprises structural parts, such as first and second retaining plates between which the electrochemical cells are arranged, and a first sensor and/or actuator element is arranged in contact with one of said structural parts;

the support structure comprises a housing having a plurality of walls, and a first sensor and/or actuator element is arranged in contact with one of the walls of the housing;

the first sensor and/or actuator element is built into the support structure or rendered integral, for example by bonding or insert molding or welding, to the surface of said support structure.

In a second variant, at least two of the electrochemical cells are electrically connected together by an electrical connection part, and the battery further comprises at least one second self-powered sensor and/or actuator arranged in contact with the electrical connection part able to measure a physical quantity relating to, and/or to generate an action or a physical effect on, its environment.

According to one embodiment of this second variant, the second sensor and/or actuator element is integrated into the electrical connection part or rendered integral with, for example by bonding or insert molding or welding, the surface of said electrical connection part.

According to some embodiments of the first or second variant, the battery further comprises one or more of the following characteristics, taken in isolation or according to all technically possible combinations:

- the at least one sensor and/or actuator element comprises an electrical supply system of the secondary cell and/or primary cell type;
- at least one of the sensor and/or actuator elements is a sensor capable of measuring an amount of detected gas or liquid, and/or the composition of a detected gas or liquid, and/or a salt concentration, and/or conductivity, and/or a mechanical stress and/or a temperature, and/or a pressure, and/or a mechanical deformation, and/or an electrical potential;
- at least one of the sensor and/or actuator elements is an actuator capable of generating a displacement, and/or a force, and/or a temperature change, and/or a change in pressure, and/or an electrical current, and/or an electrical voltage, and/or the release of one or more substances or of one or more compounds, and/or the issue of an electromagnetic signal, and/or the issue of a mechanical signal;
- at least one of the sensor and/or actuator elements is an actuator capable of generating an action or a physical effect on its environment from an external command and/or upon reaching a threshold value measured by said at least one sensor and/or actuator element or by another of said sensor and/or actuator elements;
- at least one of said sensor and/or actuator elements comprises a memory capable of storing information;
- at least one of said sensor and/or actuator elements comprises a receiver capable of receiving information wirelessly from the outside;
- at least one of said sensor and/or actuator elements comprises a transmitter capable of transmitting information wirelessly to the outside;
- at least one of said sensor and/or actuator elements is capable of switching from one to the other of a first power consumption level mode, or sleep mode, and a second power consumption level mode, or operating mode, greater than the first power consumption level;
- the sensor and/or actuator elements are capable of operating over a temperature range from −40° C. to +250° C., and preferably from −20° C. to +80° C.;
- the sensor and/or actuator elements are capable of operating under a relative pressure with respect to the external pressure substantially equal to 15 bar;
- at least one of said sensor and/or actuator elements has a shape that is inscribed within a volume less than or equal to 125 mm$^3$;
- at least one of the said sensor and/or actuator elements has a shape, the largest dimension of which is less than or equal to 5 mm;
- at least one of said sensor and/or actuator elements has a shape that is inscribed in a volume less than or equal to 5 mm$^3$, preferably less than or equal to 1 mm$^3$;
- at least one of said sensor and/or actuator elements has a shape of which the largest dimension is substantially between 1000 μm and 100 nm;
- at least one of said sensor and/or actuator elements is encapsulated in, or totally or partially coated with a material for chemical protection and/or insulation with respect to its environment, such as a metal material, for example aluminum, a metal alloy, for example a stainless steel, a ceramic material, a polymer, for example a polyolefin.

Thus, the electrochemical cell and the battery according to the invention enable, in complete autonomous fashion, the collection of critical information and/or the performance of specific actions, in a precise manner and without impact on the operation of the cell or of the battery, with a view to monitoring the operation and/or acting on the operation of the cell or of the battery, in order to be able to ensure the safety of this cell or this battery.

Indeed, to achieve this the electrochemical cell and the battery according to the invention do not require auxiliary wired power or communication systems, nor complex equipment, which could be defective in an abnormal operating situation.

In addition, the fact of not having to use sealed wire feedthroughs on the electrochemical cell casing, eliminates a source of internal or external failure or pollutions in the case of use at the core of the electrochemical cell.

Collection from inside of critical information is without impact on the electrochemical performance of the cell, and therefore of the battery.

The provision of information by the sensor elements and/or the action undertaken by the actuator elements is performed as close as possible to where the reactions are occurring, which makes it possible to obtain highly precise information and/or to perform an action in a highly precise manner, thereby minimizing measurement kinetics, and thus not substantially impacting the measurements or performance of the electrochemical cell such as specific and volume energy densities.

The micrometric or even nanometric dimensions of the sensor and/or actuator elements allow integration into important regions, such as the core of the electrochemical cell (in particular into the electrode plate group).

In the case of the actuator elements, this gives the possibility of acting on the core of the electrochemical cell by generating physico-chemical phenomena capable of ensuring the safety of this cell during potentially abnormal situations.

The characteristics and advantages of the invention will become apparent on reading the following description, given by way of non-limiting example, with reference to the following figures.

DETAILED DESCRIPTION OF THE INVENTION

Figure 1:
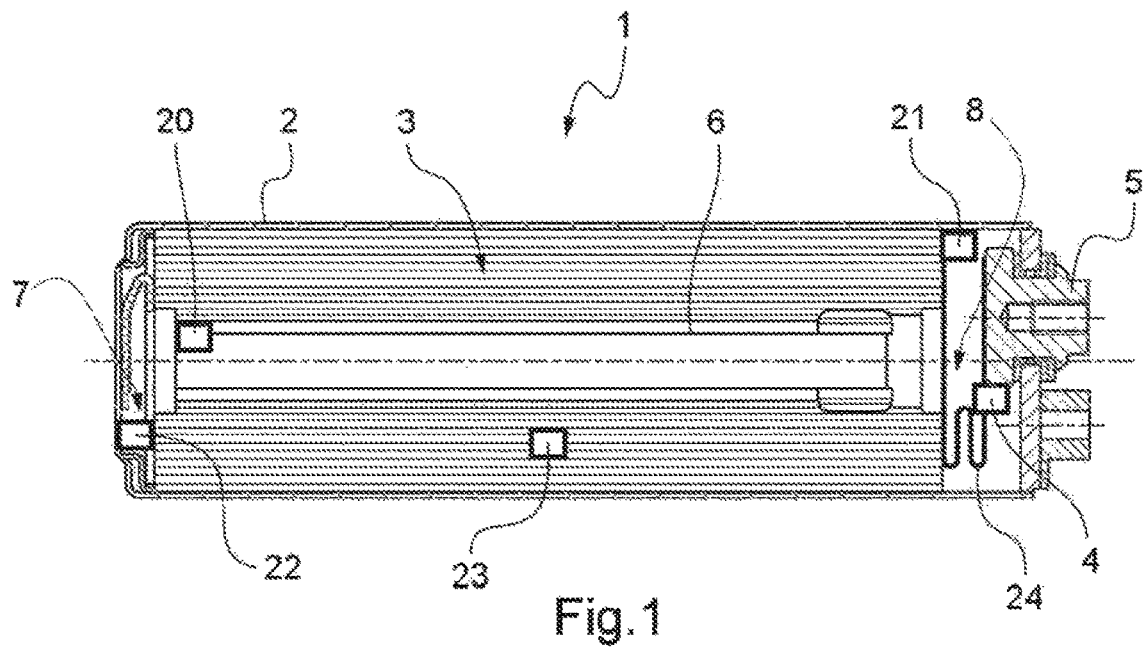
FIG. 1: a diagrammatic representation of an example of an electrochemical cell according to the invention, seen in cross-section.
Figure 2:
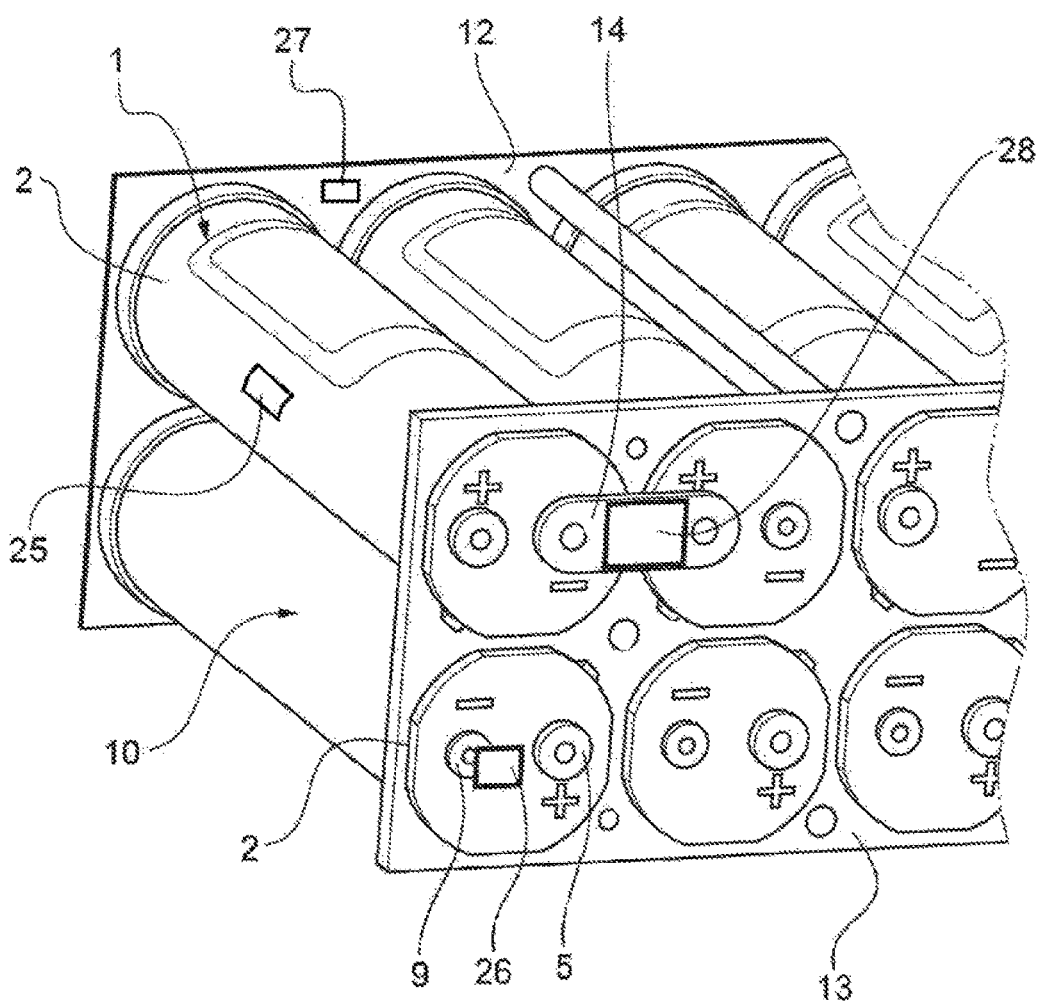
FIG. 2: a diagrammatic representation of an example of a battery according to the invention.

In the present description, an example of a Li-ion electrochemical cell of generally cylindrical shape is illustrated FIG. 1 as well as a battery comprising several such electrochemical cells, illustrated in FIG. 2. However, all the considerations presented in this description, except when explicitly mentioned, apply to an electrochemical cell of a type other than a Li-ion cell and of another shape, different to that of a strictly cylindrical shape, as well as to a battery comprising other types of electrochemical cells.

FIG. 1 shows an example of an electrochemical cell 1 according to the invention, of the Li-ion type, and having a generally cylindrical shape.

The cell 1 comprises a closed casing 2 defining an internal volume inside which an electrode plate group 3 is arranged. This electrode plate group 3 comprises an alternation of positive and negative electrodes respectively connected to positive and negative electrical output terminals, including output terminal 5, and surrounding separators. The electrode plate group 3 is impregnated with electrolyte. Furthermore, this electrode plate group 3 is connected by connecting means 4 to the electrical output terminal 5.

FIG. 2 shows a battery comprising several electrochemical cells, only cells 1 and 10 of which bear a reference numeral. Cell 1 of the battery in FIG. 2 is identical to the cell 1 shown in FIG. 1. Cell 10 and the other non-referenced cells can also be identical to cell 1, in the sense in particular of the integration of the sensor and/or actuator elements according to the invention as will be described in more detail hereinafter, or else different, that is to say not incorporating such sensor and/or actuator elements, or integrating only a portion of such sensor and/or actuator elements, or integrating such sensor and/or actuator elements but positioned differently.

Thus, cell 1 comprises at least one sensor and/or actuator element, arranged in contact with one of the components 2 to 5 of cell 1. This sensor and/or actuator element, in its sensor function, is able to measure a physical or chemical quantity relating to its environment, and/or in its actuator function is able to generate an action or a physical effect on its environment.

The relevant components 2 to 5 of cell 1 are therefore the casing 2, the electrode plate group 3, the connection means 4 and at least one of the output terminals. Optionally, in the case of an electrochemical cell 1 of a generally cylindrical shape, the electrode plate group 3 is wound around an axial winding spindle 6, and this axial winding spindle 6 can be part of the list of relevant components, with therefore a sensor and/or actuator element in contact with this axial winding spindle 6

In the example shown, seven sensor and/or actuator elements 20 to 26 are shown in contact with one of the components 2 to 6 of cell 1.

Thus:
sensor and/or actuator element 20 is arranged in contact with the winding spindle 6;
sensor and/or actuator element 21 is arranged in contact with the connection means 4, for example at one of the ends of the electrode plate group 3, in contact with the positive electrodes and/or the negative electrodes and/or the separators;
sensor and/or actuator elements 22, 24 are each arranged in an unoccupied space located between the casing 2 and one of the ends of the electrode plate group 3, for example the circuit breaker region 7 for sensor and/or actuator element 22 and the current connection region 8 for sensor and/or actuator element 24 (in this case, sensor and/or actuator element 24 is in contact for example with the connection means 4 and/or an output terminal 5);
sensor and/or actuator element 23 is arranged in contact with the electrode plate group 3, for example at the core of this electrode plate group 3, in contact with the positive electrodes and/or the negative electrodes and/or the separators, and/or in an electrolyte;
sensor and/or actuator element 25 (visible in FIG. 2) is arranged in contact with the casing 2, outside the latter;
sensor and/or actuator element 26 is arranged in contact with at least one of the two output terminals 5, 9 outside the casing 2.

Sensor and/or actuator element 20 can be positioned more precisely in the unoccupied space region, at axial winding spindle 6, in contact with the latter and optionally with the free electrolyte and/or with the free gases in this region.

This positioning allows sensor and/or actuator element 20, in its sensor function, to preferentially provide information on pressure, temperature or chemical composition of the gases or liquids in the region in question. In its function of an actuator, sensor and/or actuator element 20 can, for example, generate an electrical current or voltage, a stress, a force, a mechanical displacement, the release of substances or compounds, or the issue of an electromagnetic or mechanical signal.

Sensor and/or actuator element 21 can be positioned more precisely so as to be integral with the positive and/or negative electrodes and/or the separators, in contact with or with the free electrolyte and/or with the free gases in this region.

This positioning allows sensor and/or actuator element 21, in its sensor function, to provide preferentially electrical voltage, pressure, temperature, or chemical composition of the gases or liquids in this region. In its actuator function, sensor and/or actuator element 21 can, for example, generate stress, strain, mechanical displacement (e.g., lead to breaking or disconnection of a component), a current or an electrical voltage, the release of substances or compounds, or the issue of an electromagnetic or mechanical signal.

Sensor and/or actuator element 22 can be positioned more precisely in the unoccupied space region such as circuit breaker region 7, in contact therewith and/or with the free electrolyte and/or with the free gases in this region, incorporated in the material itself of the casing 2 at this region or rendered integral therewith at its surface This positioning allows sensor and/or actuator element 22, in its sensor function, to preferentially provide information on pressure, stress, strain, temperature, or chemical composition of the gases or liquids in this region. In its actuator function, sensor and/or actuator element 22 can for example generate a stress, a force, a mechanical displacement (which can lead to the breaking or disconnection of a component), a current or an electrical voltage, the release of substances or compounds, or even the issue of an electromagnetic or mechanical signal.

Sensor and/or actuator element 23 can be positioned more precisely so as to be rigidly connected to the positive and/or negative electrodes and/or the separators, in contact with the free electrolyte and/or with the free gases in this region, for example by direct incorporation during the production phases of the electrodes.

This positioning allows sensor and/or actuator element 23, in its sensor function, to provide preferentially voltage, pressure, temperature or chemical composition information on the gases or liquids in the region in question. In its actuator function, sensor and/or actuator element 23 can for example generate a stress, a strain, a mechanical displacement (which can lead to breaking or disconnection of a component), a current or a voltage, the release of substances or compounds capable of decomposing or melting or dissolving the surrounding materials, the issue of an electromagnetic or mechanical signal.

Sensor and/or actuator element 24 can be positioned more precisely in the unoccupied space region, for example in the current connection region 8, in contact with the free electrolyte and/or with the free gases in this region, by integration into, or at the surface thereof the internal connection arrangements 4 or casing 2.

This positioning allows sensor and/or actuator element 24, in its sensor function, to preferentially provide information on pressure, stress, strain, temperature, chemical composition of the gases or liquid in this region. In its actuator function, sensor and/or actuator element 24 can for example generate a stress, a force, a mechanical displacement (which can lead to the breaking or disconnection of a component), a current or a voltage, the release of substances or compounds, or even the issue of an electromagnetic or mechanical signal.

Sensor and/or actuator element 25 can be positioned more precisely on, or in, the surface of the casing 2 outside the electrochemical cell.

This positioning allows sensor and/or actuator element 25, in its sensor function, to preferentially provide pressure, stress, strain, temperature information. In its actuator function, sensor and/or actuator element 25 can, for example, generate a current or voltage, or the issue of an electromagnetic or mechanical signal.

Sensor and/or actuator element 26 can be positioned more precisely on, or in, either of the output terminals 5, 9, outside the electrochemical cell.

This positioning allows sensor and/or actuator element 26, in its sensor function, to preferentially provide temperature information. In its actuator function, sensor and/or actuator element 26 can, for example, generate a current or voltage, or the issue of an electromagnetic or mechanical signal.

Furthermore, a battery according to the invention, an example of which is represented in FIG. 2, also comprises one or more sensor and/or actuator elements, which in their sensor function are capable of measuring a physical or chemical quantity relating to their environment, and/or in their actuator function, are capable of generating an action or a physical effect on their environment.

As explained above, the battery comprises one or more electrochemical cells 1, 10. Out of these electrochemical cells 1, 10, one or more can be of the type discussed above, itself integrating one or more sensor and/or actuator elements as explained above.

Alternatively, or in combination (as is the case in FIG. 2), with the presence of one or more electrochemical cells 1 incorporating themselves one or more sensor and/or actuator elements 20 to 26, the battery according to the invention may comprise two or more electrochemical cells 1, 10 electrically connected in parallel and/or in series, in particular by means of an electrical connection part 14 itself capable of forming part of electrical connection means of the busbar type or a set of busbars. The battery further comprises a first sensor and/or actuator element 27 and/or a second sensor and/or actuator element 28.

Cells 1, 10 are arranged in a support structure, and the first sensor and/or actuator element 27 is arranged in contact with the support structure 12, 13.

The support structure may contain structural parts 12, 13, such as first and second retaining plates 12, 13 as shown in FIG. 2, between which the electrochemical cells 1 to 10 are arranged, the first sensor and/or actuator element 27 can then be placed in contact with one of these plates 12, 13, in this case the plate 12 in FIG. 2.

The support structure may also include a housing having a plurality of walls. The first sensor and/or actuator element 27 can then be arranged in contact with one of the walls of the housing.

Regardless of the support structure, the battery may also include a second sensor and/or actuator element 28 as indicated above. This second sensor and/or actuator element 28 can be arranged in contact with the connection part 14, or more generally with bus-bar connection means.

The positioning of the first and second sensor and/or actuator elements 27, 28 allows the latter, in their sensor function, to preferentially provide temperature information. In their actuator function, the first and second sensor and/or actuator elements 27, 28 can for example generate a current or voltage, or even issue an electromagnetic or mechanical signal.

In the remainder of the description, and unless otherwise indicated, we use the term sensor and/or actuator elements to designate both sensor and/or actuator elements 20 to 26 which are built into or are against cell 1, and the first and second sensor and/or actuator elements 27, 28 which are built into the battery but not into the cell 1.

The sensor and/or actuator elements 20 to 28 are of the self-powered type. They do not require the use of an external power source. More specifically, the term "self-powered" means that the sensor and/or actuator elements have their own source of power and are neither powered by the electrochemical cell in which they are placed, nor powered by an external power supply. The sensor and/or actuator elements thus comprise an internal power supply system, for example of the secondary cell and/or primary cell type. Other internal power supply systems may be contemplated, alone or in combination, such as a system using supercapacitance, a piezoelectric element, a capacitor, etc.

The sensor and/or actuator elements 20 to 28, in their sensor function, can be of the type capable of measuring one or more of the following information:

quantity of detected gas or liquid,
composition of a detected gas or liquid,
a salt concentration,
a conductivity,
a mechanical stress,
a temperature,
pressure,
a mechanical deformation,
an electrical potential The sensor and/or actuator elements 20 to 28, in their actuator function, may be of the type able to generate one or more of the following actions, or one or more of the following physical effects, on their environment:

a displacement,
a force,
a temperature change,
a pressure change,
an electrical current,
an electrical voltage,
release of one or more substances or one or more compounds,
issue of an electromagnetic signal,
issue of a mechanical signal.

The action or the physical effect generated by sensor and/or actuator element 20 to 28 on its environment, in its actuator function, can be triggered from an external command. Alternatively, or in combination, it can also be triggered upon reaching a threshold value measured by sensor and/or actuator element 20 to 28, or by another of these sensor and/or actuator elements 20 to 28, in its sensor function.

It is possible to provide for sensor and/or actuator elements 20 to 28 to comprise a memory, making it possible to store information, whether it is information received from the outside, or information measured by the sensor and/or actuator element 20 to 28 itself in its sensor function.

Provision may also be made for sensor and/or actuator elements 20 to 28 to be able to receive from the outside, and/or to transmit information, wirelessly, respectively, by means of a wireless receiver, respectively a wireless transmitter.

The sensor and/or actuator elements 20 to 28 can also be configured to be able to operate in a standby or sleep mode, i.e. at a first power consumption level mode lower than the second energy consumption level corresponding to the operating mode, that is to say the mode in which the sensor and/or actuator element 20 to 28 is able to perform its sensor and/or actuator function.

Thus, sensor and/or actuator elements 20 to 28 are capable of switching from one to the other of the first power consumption level mode, or standby or sleep mode, and the second power consumption level mode, or operating mode.

The sensor and/or actuator elements 20 to 28 can operate in a high temperature range. They are preferably capable of operating over a temperature range from −40° C. To +250° C., and more preferably from −20° C. To +80° C.

Furthermore, the sensor and/or actuator elements 20 to 28 are capable of operating under a relative pressure with respect to the external pressure substantially equal to 15 bar.

The sensor and/or actuator elements 20 to 28 are of micrometric or even nanometric size.

Preferably, sensor and/or actuator elements 20 to 28 provide one or more of the following dimensional characteristics:
- their overall shape is inscribed in a volume less than or equal to 125 mm$^3$;
- their overall shape has a largest dimension of less than or equal to 5 mm;
- their overall shape is inscribed in a volume less than or equal to 5 mm$^3$, preferably less than or equal to 1 mm$^3$;
- their overall shape has a largest dimension substantially comprised between 1000 μm and 100 nm.

Such dimensions make it possible to integrate these sensor and/or actuator elements 20 to 28 into the core of the components, in particular into the core of the electrode plate group 3.

The sensor and/or actuator elements 20 to 28 are encapsulated in a protective material, or totally or partially coated with such a material. This protective material is capable of providing sensor and/or actuator element 20 to 28 with protection, for example of a chemical nature, and/or electrical insulation, and/or a seal, with respect to the environment. It may be, for example, a metal material, such as aluminum, or a metal alloy, such as stainless steel. It may also be a ceramic material, or a polymer such as a polyolefin.

In general, provision may be made for sensor and/or actuator elements 20 to 28 to be integrated into the material of the component with which it is in contact, or to be rendered integral therewith for example by bonding or insert molding or welding, at its surface.

Thus, the sensor and/or actuator elements 20 to 26 can be integrated into the corresponding component 2 to 6 of cell 1, or rendered integral at the surface of this component 2 to 6. Moreover, the first sensor and/or actuator element 27 can be built into the support structure of the battery or rendered integral with the surface of this support structure. Finally, the second sensor and/or actuator element 28 can be built into the connection part 14 of the battery or rendered integral with the surface of this connection part.

Examples of configuration of an electrochemical cell or a battery according to the invention are given below.

Example 1

The cell comprises at least one sensor and/or actuator element 22 located as shown in FIG. 1 (see above for details of locations).

This sensor and/or actuator element 22 is a pressure sensor, protected by aluminum, welded to the casing and measuring 1 mm$^3$.

When the pressure reaches a threshold value of 15 bar, a separate actuator element (not shown), or sensor element 22 itself which is in this case both a sensor and actuator element 22, sends a signal wirelessly to an external battery management system which contains the electrochemical cell. The battery management system may then shut-off or divert the current using a shunt circuit or a switch.

Example 2

The battery comprises at least one sensor and/or actuator element 28 located as shown in FIG. 2 (see above for details of locations). This sensor and/or actuator element 28 is a temperature sensor embedded in a polymer matrix, insert molded.

When a threshold value of 80° C. is reached, a separate actuator element (not shown), or sensor element 28 itself which is in this case both a sensor and actuator element 28, sends a signal wirelessly to a battery management system. The battery management system may then cut or divert the current through a shunt or switch.

Example 3

The electrochemical cell comprises at least one sensor and/or actuator element 20 located as shown in FIG. 1 (see above for details of locations). This sensor and/or actuator element 20 is a gas sensor, protected by stainless steel, measuring approximately 1 mm$^3$, and bonded to the central spindle.

This sensor 20 stores the data that it measures on a regular basis, which data can then be used in the context of post-mortem analysis of the electrochemical cell.

Example 4

The electrochemical cell comprises at least one sensor and/or actuator element 23 and a sensor and/or actuator element 22 located as shown in FIG. 1 (see above for details of locations). The sensor and/or actuator element 23 is a polymer-protected temperature sensor measuring about 1 mm$^3$ and arranged at the core of the electrode plate group, in contact with the positive electrodes. The sensor and/or actuator element 22 is an actuator, the operation and the role of which will be explained below.

Sensor 23 in a standby or sleep mode stores the data that it measures. This data may be wirelessly transmitted to a battery management system that contains the electrochemical cell. An electronic command can then be sent by the battery management system to the actuator element 22, to drive this actuator 22 which is configured to pierce the safety membrane of the electrochemical cell.

The present description is given by way of example and is not limiting of the invention, in particular with respect to the type and the overall shape of the electrochemical cells which are not necessarily cylindrical Li-ion cells.

The invention claimed is:

1. A lithium-ion electrochemical cell comprising a sealed casing defining an internal volume inside which an electrode plate group is arranged comprising alternating positive and negative electrodes respectively connected to two positive and negative electrical output terminals and arranged on both sides of separators, said electrode plate group being impregnated with electrolyte and connected by connection means to one of the electrical output terminals, the electrochemical cell comprising one or more sensor or actuator element, or sensor and actuator elements each arranged in contact with a component within the group comprising the casing, the electrode plate group, the connection means and an output terminal, and being able to measure a physical or chemical quantity relating to its environment or to generate an action or a physical effect on its environment, or both to measure a physical or chemical quantity relating to its environment and to generate an action or a physical effect on its environment, and wherein the at least one sensor or actuator element, or sensor and actuator elements are self-powered and the at least one sensor or actuator element, or sensor and actuator elements has a shape that is inscribed within a volume less than or equal to 5 mm$^3$.

2. The electrochemical cell according to claim 1, wherein the at least one sensor or actuator element, or sensor and actuator elements comprises an electrical supply system of the secondary cell type or primary cell type, or of the second cell type and primary cell type.

3. The electrochemical cell according to claim 1, wherein at least one of the sensor or actuator element, or sensor and actuator elements is a sensor capable of measuring a combination of one or more of: an amount of detected gas or liquid, the composition of a detected gas or liquid, a salt concentration, conductivity, a mechanical stress, a temperature, a pressure, a mechanical deformation, an electrical potential.

4. The electrochemical cell according to claim 1, wherein at least one of said sensor or actuator element, or sensor and actuator elements is an actuator capable of generating a combination of one or more of: a displacement, a force, a temperature change, a change in pressure, an electrical current, an electrical voltage, the release of one or more substances or of one or more compounds, the issue of an electromagnetic signal, the issue of a mechanical signal.

5. The electrochemical cell according to claim 1, wherein at least one of the sensor or actuator element, or sensor and actuator elements is an actuator capable of generating an action or a physical effect on its environment from an external command or upon reaching a threshold value measured by said at least one sensor or actuator element, or sensor and actuator elements or by another of said sensor or actuator element, or sensor and actuator elements, or from an external command and upon reaching a threshold value measured by said at least one sensor or actuator element, or sensor and actuator elements or by another of said sensor or actuator element, or sensor and actuator elements.

6. The electrochemical cell according to claim 1, wherein at least one of said sensor or actuator element, or sensor and actuator elements comprises a memory capable of storing information.

7. The electrochemical cell according to claim 1, wherein at least one of said sensor or actuator element, or sensor and actuator elements comprises a receiver capable of receiving information wirelessly from the outside.

8. The electrochemical cell according to claim 1, wherein at least one of said sensor or actuator element, or sensor and actuator elements comprises a transmitter capable of transmitting information wirelessly to the outside.

9. The electrochemical cell according to claim 1, wherein at least one of said sensor or actuator element, or sensor and actuator elements is capable of switching from one to the other of a first power consumption level mode, or sleep mode, and a second power consumption level mode, or operating mode, greater than the first power consumption level.

10. The electrochemical cell according to claim 1, wherein at least one of the said sensor or actuator element, or sensor and actuator elements has a shape, the largest dimension of which is less than or equal to 5 mm.

11. The electrochemical cell according to claim 1, wherein at least one of said sensor or actuator element, or sensor and actuator elements has a shape that is inscribed in a volume less than or equal to 1 mm$^3$.

12. The electrochemical cell according to claim 1, wherein at least one of said sensor or actuator element, or sensor and actuator elements has a shape of which the largest dimension is between 1000 μm and 100 nm.

13. The electrochemical cell according to claim 1, wherein at least one of said sensor or actuator element, or sensor and actuator elements is encapsulated in, or totally or partially coated with a material for chemical protection or for insulation or for both protection and insulation with respect to its environment.

14. The electrochemical cell according to claim 13, wherein the material is a metal or metal alloy material, or a ceramic material, or a polymer.

15. The electrochemical cell according to claim 13, wherein the material is aluminum or stainless steel or a polyolefin.

16. The electrochemical cell according to claim 1, wherein the electrode plate group is wound around an axial winding spindle, and in that at least one of the sensor or actuator element, or sensor and actuator elements is arranged in contact with the axial winding spindle.

17. The electrochemical cell according to claim 1, wherein at least one of said sensor or actuator element, or sensor and actuator elements is arranged at one of the ends of the electrode plate group in contact with one or more of the positive electrodes, the negative electrodes, the separators.

18. The electrochemical cell according to claim 1, wherein at least one of the said sensor or actuator element, or sensor and actuator elements is arranged in an unoccupied space located between the casing and one of the ends of the electrode plate group.

19. The electrochemical cell according to claim 18, wherein at least one of the said sensor or actuator element, or sensor and actuator elements is arranged in a circuit breaker region or a current connection region located between the casing and one of the ends of the electrode plate group.

20. The electrochemical cell according to claim 18, wherein the at least one of said sensor or actuator element, or sensor and actuator elements is arranged in a current connection region, in contact with the connection means or an output terminal, or with the connection means and an output terminal.

21. The electrochemical cell according to claim 1, wherein at least one of said sensor or actuator element, or sensor and actuator elements is arranged at the core of the electrode plate group, in contact with one or more of: the positive electrodes, the negative electrodes, the separators, the electrolyte.

22. The electrochemical cell according to claim 1, wherein at least one of said sensor or actuator element, or sensor and actuator elements is arranged against, and outside the casing.

23. The electrochemical cell according to claim 1, wherein at least one of said sensor or actuator element, or sensor and actuator elements is arranged against at least one of the output terminals outside the casing.

24. A battery comprising one or more electrochemical cells electrically connected in parallel or in series, or in parallel and in series, wherein at least one of the electrochemical cells is the electrochemical cell according to claim 1.

* * * * *